United States Patent
Wong

(10) Patent No.: US 6,340,556 B1
(45) Date of Patent: Jan. 22, 2002

(54) TAILORING OF LINEWIDTH THROUGH ELECTRON BEAM POST EXPOSURE

(75) Inventor: Selmer Wong, San Diego, CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/590,065

(22) Filed: Jun. 8, 2000

Related U.S. Application Data

(60) Provisional application No. 60/147,114, filed on Aug. 4, 1999.

(51) Int. Cl.$^7$ .................................................. G03C 5/00
(52) U.S. Cl. ........................ 430/296; 430/17; 430/311; 430/326; 430/328; 430/330; 430/942
(58) Field of Search ........................... 430/17, 296, 311, 430/326, 328, 330, 942

(56) References Cited

U.S. PATENT DOCUMENTS 6,117,622 A * 9/2000 Eisele et al. ................. 430/328

* cited by examiner

*Primary Examiner*—Christopher G. Young
(74) *Attorney, Agent, or Firm*—Roberts & Mercanti, LLP

(57) ABSTRACT

A process for decreasing the linewidth of photoresist images which are suitable for use in the production of microelectronic devices such as integrated circuits. A photosensitive composition is coated onto a substrate, exposed to activating energy to decompose the polymer in the imagewise exposed areas; and developed to remove the exposed nonimage areas thus producing a pattern of lines having a linewidth of from about 100 nm to about 200 nm. Then the image areas are controllably irradiated to sufficient electron beam radiation to thereby reduce the linewidth by an amount of from about 5% to about 50%.

27 Claims, No Drawings

TAILORING OF LINEWIDTH THROUGH ELECTRON BEAM POST EXPOSURE

CROSS REFERENCE TO RELATED APPLICATION

This application claims the benefit of U.S. provisional application Ser. No. 60/147,114 filed Aug. 4, 1999 which is incorporated herein by reference.

BACKGROUND OF THE INVENTION

1. Field of the Invention

The present invention relates to a process for decreasing the linewidth and contact hole diameters of photoresist images which are suitable for use in the production of microelectronic devices such as integrated circuits. More particularly, the invention provides a process for decreasing the linewidth and contact hole diameters of images produced from positive working 193 nm sensitive photoresists.

2. Description of the Related Art

As feature sizes in the production of integrated circuits approach 100 nm, problems of packing density become increasingly difficult to overcome. The major problem is lithographic exposure tool resolution for exposure of photoresists. Photoresists are well known in the art. These light sensitive materials are applied as a thin film coating to a suitable substrate. Upon imagewise exposure of the coated substrate to actinic radiation, the difference in solubility rates between exposed and unexposed areas produces an image on the substrate after development. The uncovered substrate is thereafter subjected to an etching process. Frequently, this involves a plasma etching against which the resist coating must be sufficiently stable. For a positive tone photoresist, the coating protects those areas of the substrate from the etchant which were covered during the exposure, and thus the etchant is only able to etch the areas which were uncovered. The photoresist coating protects the covered areas of the substrate from the etchant and thus the etchant is only able to etch the uncovered areas of the substrate. Thus, a pattern can be created on the substrate which corresponds to the pattern of the mask or template that was used to create selective exposure patterns on the coated substrate prior to development.

The ability to reproduce very small dimensions, is extremely important in the production of large scale integrated circuits on silicon chips and similar components. As the integration degree of semiconductor devices becomes higher, finer photoresist film patterns are required. One way to increase circuit density on such a chip is by increasing the resolution capabilities of the resist. Positive photoresists have been found to be capable of much higher resolution and have almost universally replaced negative resists for this purpose.

The optimally obtainable microlithographic resolution is essentially determined by the radiation wavelengths used for the selective irradiation. However the resolution capacity that can be obtained with conventional deep UV microlithography (i.e. 248 nm) has its limits. In order to be able to sufficiently resolve optically small structural elements, e.g. features of 0.18 µm and smaller, radiation with a wavelength of 193 nm, in particular, the radiation of argon fluoride excimer lasers, which has a wavelength of 193 nm has been employed.

Chemical amplification resist films have been developed, which have been found to have superior resolution. A typical chemical amplification photoresist film comprises a polymer, a photoacid generator, and other optional additives. The polymer is required to be soluble in the chosen developer solution, and have high thermal stability and low absorbance to the 193 nm exposure wavelength in addition to having excellent etch resistance. 193 nm photoresists are based on chemically amplified deprotection. With this mechanism, a molecule of photogenerated acid catalyzes the breaking of bonds in a protecting group of a polymer. During the deprotecting process, another molecule of the same acid is created as a byproduct, and continues the acid-catalytic deprotection cycle. The chemistry of a 193 nm photoresist is based on polymers such as, but not limited to, acrylates, cyclic olefins, acrylates with pendant alicyclic groups, and hybrids of the aforementioned polymers which lack aromatic rings, which contribute to opacity at 193 nm. It has thus been known to utilize photoresists based on methacrylate resins for the production of microstructures by means of 193 nm radiation.

However, depending on the imaging configuration, and type of chemically amplified resist, sometimes even chemically amplified resist films are not able to adequately resolve integrated circuit lines having a thickness in the 100–200 nm range. It has now been found according to the present invention, that by subjecting a developed photoresist having lines having a thickness in the 100–200 nm range to electron beam irradiation, that it is possible to reduce the linewidth of the lines produced in the resist image while still imparting sufficient integrity to permit plasma etching without intolerable resist profile degradation. The present invention therefore provides a process for reducing the linewidth of 100–200 nm photoresist lines by from about 5 to about 50% while maintaining sufficient line integrity to permit plasma etching.

SUMMARY OF THE INVENTION

The invention provides a process for reducing the linewidth of a photoresist image which comprises:

(a) coating and drying a photosensitive composition onto a substrate, which photosensitive composition comprises
  (i) at least one water insoluble, acid decomposable polymer, wherein said polymer is present in the photosensitive composition in an amount sufficient to form a uniform film of the composition components when it is coated on a substrate and dried;
  (ii) at least one photosensitive compound capable of generating an acid upon exposure to sufficient activating energy, said photosensitive compound being present in an amount sufficient to substantially uniformly photosensitize the photosensitive composition;

(b) imagewise exposing the photosensitive composition to sufficient activating energy to cause the photosensitive compound to generate sufficient acid to decompose the polymer in the imagewise exposed areas of the photosensitive composition and produce a latent pattern of lines having a linewidth of from about 100 nm to about 200 nm;

(c) developing the photosensitive composition to thereby remove the exposed nonimage areas and leaving the unexposed image areas of the photosensitive composition in the form of a pattern of lines having a linewidth of from about 100 nm to about 200 nm;

(d) controllably irradiating the image areas of the photosensitive composition to sufficient electron beam radiation to thereby reduce the linewidth by an amount of from about 5% to about 50%.

The invention also provides a process for producing a microelectronic device image which comprises:

(a) coating and drying a photosensitive composition onto a substrate, which substrate comprises a material selected from the group consisting of silicon, aluminum, lithium niobate, polymeric resins, silicon dioxide, doped silicon dioxide, gallium arsenide, Group III/V compounds, oxides, oxynitrides, silicon nitride, titanium, titanium nitride, tantalum, tantalum nitride, copper, polysilicon, ceramics, aluminum/copper mixtures and combinations thereof, and which photosensitive composition comprises (i) at least one water insoluble, acid decomposable polymer, wherein said polymer is present in the photosensitive composition in an amount sufficient to form a uniform film of the composition components when it is coated on a substrate and dried;

(ii) at least one photosensitive compound capable of generating an acid upon exposure to sufficient activating energy, said photosensitive compound being present in an amount sufficient to substantially uniformly photosensitive the photosensitive composition;

(b) imagewise exposing the photosensitive composition to sufficient activating energy to cause the photosensitive compound to generate sufficient acid to decompose the polymer in the imagewise exposed areas of the photosensitive composition and produce a latent pattern of lines having a linewidth of from about 100 nm to about 200 nm;

(c) developing the photosensitive composition to thereby remove the exposed nonimage areas and leaving the unexposed image areas of the photosensitive composition in the form of a pattern of lines having a linewidth of from about 100 nm to about 200 nm;

(d) controllably irradiating the image areas of the photosensitive composition to sufficient electron beam radiation to thereby reduce the linewidth by an amount of from about 5% to about 50%.

The invention further provides a microelectronic device image produced by a process which comprises:

(a) coating and drying a photosensitive composition onto a substrate, which substrate comprises a material selected from the group consisting of silicon, aluminum, lithium niobate, polymeric resins, silicon dioxide, doped silicon dioxide, gallium arsenide, Group III/V compounds, oxides, oxynitrides, silicon nitride, titanium, titanium nitride, tantalum, tantalum nitride, copper, polysilicon, ceramics, aluminum/copper mixtures and combinations thereof, and which photosensitive composition comprises (i) at least one water insoluble, acid decomposable polymer, wherein said polymer is present in the photosensitive composition in an amount sufficient to form a uniform film of the composition components when it is coated on a substrate and dried;

(ii) at least one photosensitive compound capable of generating an acid upon exposure to sufficient activating energy, said photosensitive compound being present in an amount sufficient to substantially uniformly photosensitize the photosensitive composition;

(b) imagewise exposing the photosensitive composition to sufficient activating energy to cause the photosensitive compound to generate sufficient acid to decompose the polymer in the imagewise exposed areas of the photosensitive composition and produce a latent pattern of lines having a linewidth of from about 100 nm to about 200 nm;

(c) developing the photosensitive composition to thereby remove the exposed nonimage areas and leaving the unexposed image areas of the photosensitive composition in the form of a pattern of lines having a linewidth of from about 100 nm to about 200 nm;

(d) controllably irradiating the image areas of the photosensitive composition to sufficient electron beam radiation to thereby reduce the linewidth by an amount of from about 5% to about 50%.

DETAILED DESCRIPTION OF THE PREFERRED EMBODIMENT

The first step of the process according to the invention is coating and drying a photosensitive composition onto a substrate. The photosensitive compositions useful for the invention are themselves well known in the art and are composed of a mixture of a water insoluble, acid decomposable polymer, a photosensitive compound capable of generating an acid upon exposure to sufficient activating energy, and optional other ingredients. Preferably the polymer is substantially transparent to deep ultraviolet radiation at a wavelength of about 193 nm and the photosensitive compound is capable of generating an acid upon exposure to sufficient activating energy at a wavelength of about 193 nm.

Suitable substrates nonexclusively include semiconductor substrates, silicon, aluminum, lithium niobate, polymeric resins, silicon dioxide, doped silicon dioxide, gallium arsenide, Group III/V compounds, silicon nitride, tantalum, copper, polysilicon, ceramics and aluminum/copper mixtures. Lines are optionally but preferably on the substrate surface. The lines are typically formed by well known lithographic techniques and may be composed of a metal, an oxide, polysilicon, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.1 to about 1 micrometer.

Acid decomposable polymers suitable for a chemical amplification resist film for ArF laser exposure which are substantially transparent at 193 nm are well known in the art and nonexclusively include cyclic olefins, and acrylics and methacrylates such as polyalkylacrylates and polyalkylmethacrylates, norbornene containing polymers, and alicyclic polymers. Cyclic olefin materials offer superior etch resistance, surpassing even that of novolac materials. The most widely employed route involves free radical copolymerization of maleic anhydride with a cyclic olefin monomer. The maleic anhydride serves as an oxygen-rich polar unit whose hydrophilic nature offsets the hydrophobic nature of the cyclic olefin monomer. Others polymers include polymethylacrylate and polymethylmethacrylate (PMMA) as well as copolymers thereof and polymers which have a backbone of polymethylmethacrylate having pendant groups which do not substantially reduce the transparency of the polymer at 193 nm. PMMA has a particularly high transmittance to the light of 193 nm wavelength and it is known for its clarity, surface hardness, UV transparency and chemical resistance. PMMA is readily commercially available from Aldrich Chemical Company of Milwaukee, Wis. Preferably the polymer has a molecular weight in the range of from about 1,000 to about 800,000. Alicyclic polymers include acrylate/alicyclic polymers such as hybrid polymers produced by the free radical copolymerization of norbornene, maleic anhydride and either acrylic acid or t-butyl acrylate. A terpolymer of acrylonitrile, tertiary-butyl methacrylate and methacrylic acid has also been shown to have high transparency at 193 nm and excellent dry etch resistance.

Useful photosensitive compounds capable of generating an acid upon exposure to sufficient activating energy at a wavelength of about 193 nm include onium salts such as sulfonium, diazonium and iodonium salts. Sulfonium salts are described in U.S. Pat. No. 4,537,854; diazonium salts are described in Light Sensitive Systems, Kosar, J.; John Wiley & Sons, New York, 1965. Iodonium salts are described in U.S. Pat. No. 4,603,101.

The light sensitive composition may be formed by admixing the ingredients in a suitable solvent composition. In the preferred embodiment the polymer is preferably present in the overall composition in an amount of from about 50% to about 99% based on the weight of the solid, i.e. non-solvent parts of the composition. A more preferred range of copolymer would be from about 80% to about 99% and most preferably from about 82% to about 95% by weight of the solid composition parts. The photosensitive compound is preferably present in an amount ranging from about 1% to about 20% based on the weight of the solid, i.e., non-solvent parts of the composition. A more preferred range of the photosensitive compound would be from about 5% to about 20% by weight of the solid composition parts. In preparing the composition, the polymer and photosensitive compound are mixed with a sufficient amount of a solvent composition to form a uniform solution. Such solvents include propylene glycol alkyl ether acetate, butyl acetate, ethylene glycol monoethyl ether acetate, diglyme, cyclopentanone and propylene glycol methyl ether acetate, among others. The composition may additionally contain additives such as colorants, dyes, anti-striation agents, leveling agents, crosslinkers, plasticizers, adhesion promoters, speed enhancers, solvents, acid generators, dissolution inhibitors and non-ionic surfactants.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) in an amount of from about 1.0 to about 10.0 percent, based on the combined weight of the solid parts of the composition. The dye additives help provide increased resolution by inhibiting back scattering of light off the substrate. Anti-striation agents may be used up to five percent weight level, based on the combined weight of solids. Adhesion promoters which may be used include, for example, beta-(3,4-epoxy-cyclohexyl)ethyltrimethoxysilane; p-methyl-disilane-methyl methacrylate; vinyltrichlorosilane; and gamma-amino-propyl triethoxysilane up to a 4.0 percent based on the combined weight of solids. Speed enhancers that may be used include, for example, picric acid, nicotinic acid or nitrocinnamic acid at up to 20 percent, based on the combined weight of copolymer and solids. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas. Non-ionic surfactants that may be used include, for example, nonylphenoxy poly (ethyleneoxy)ethanol; octylphenoxy(ethyleneoxy)ethanol; and dinonyl phenoxy poly(ethyleneoxy)ethanol at up to 10 percent based on the combined weight of solids.

Photoresists which are photosensitive at 193 nm are well known in the art and widely commercially available, Such include K98 and D3 available from the Shipley Company; 620-10 from Olin Microelectronics Materials, AM01, AM02 and AM03 from Japan Synthetic Rubber Company, TOK-TArF-5A-1 and TOK-TArF-6A-1 from Tokyo Ohka Kogyo Co. Ltd, DUV-18L from Brewer Science. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/ (poly methyl methacrylate-methacrylic acid).

In the production of the microelectronic device of the present invention, one coats and dries the foregoing photosensitive composition on a suitable substrate. The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. In a preferred embodiment of the invention, the photoresist layer is formed by centrally applying a liquid photoresist composition to the upper surface on a rotating wheel at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. The thickness of the photoresist layer may vary depending on the viscosity of liquid photoresist composition that is applied, the spin speed, the acceleration rate to spin speed, and spin time, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

After the resist composition solution is coated onto the substrate, the substrate is temperature treated at approximately 20° C. to 200° C. This temperature treatment is done in order to reduce and control the concentration of residual solvents in the photoresist while not causing substantial thermal degradation of the photosensitizer. In general one desires to minimize the concentration of solvents and thus this temperature treatment is conducted until substantially all of the solvents have evaporated and a thin coating of photoresist composition, on the order of a micron in thickness, remains on the substrate. In a preferred embodiment the temperature is conducted at from about 50° C. to about 150° C. A more preferred range is from about 90° C. to about 120° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. Treatment times increase to about 20 to about 40 minutes when conducted in a convection oven at these temperatures.

After deposition onto the substrate, the photoresist layer is imagewise exposed, such as via an ArF laser or through a polysilicon etch mask to actinic radiation. This exposure renders the photoresist layer more soluble after exposure than prior to exposure. When such a chemical amplification resist is exposed to light, photogenerated acid induces a catalytic chain reaction to a photoresist film, generating a significant amount of protons. In the resist, protons bring about a large change in the solubility of the resin. When the photoresist film is irradiated by a high energy beam, e.g. 193 nm, acid ($H^+$) is generated, reacting with the polymer. Acid is again generated and reacts with unreacted polymer. The acid reacted polymer is then dissolved in a developing solution. In contrast, the polymer at the non-exposed region maintains its structure which is insoluble to the developing solution. With such a mechanism, a good profile pattern can be made on a wafer substrate. The amount of actinic radiation used is an amount sufficient to render the exposed portions of the photoresist layer imagewise soluble in a suitable developer. Preferably, UV radiation is used in an amount sufficient to render the exposed portions of the photoresist layer imagewise soluble in a suitable developer. UV exposure doses preferably range from about 5 $mJ/cm^2$ to about 300 $mJ/cm^2$, more preferably from about 5 $mJ/cm^2$ to about 100 $mJ/cm^2$ and still more preferably from about 10 $mJ/cm^2$ to about 30 $mJ/cm^2$.

Exposure is preferably via an ArF laser, i.e. at a wavelength of from about 193 nm. When an ArF laser is used for exposure, exposure doses preferably ranges from about 1 $mJ/cm^2$ to about 10 $mJ/cm^2$, more preferably from about 2 $mJ/cm^2$ to about 8 $mJ/cm^2$.

Preferably the process further comprises the step of heating the imagewise exposed photosensitive composition prior to developing, such as by baking, for a sufficient time and temperature to increase the rate at which the acid decomposes the polymer in the imagewise exposed areas of the photosensitive composition. This drives the acid reaction for better image formation. Such a heat treatment may be conducted at temperatures of from about 50° C. to about 150° C., preferably from about 120° C. to about 150° C. for from about 30 seconds to about 2 minutes. In a high activation energy chemically amplified resist, heating is needed to activate the acid deprotection reaction. In low activation energy resists, this post exposure bake is not necessary to drive the acid deprotection reaction.

The development step may be conducted by immersion in a suitable developing solution. The solution is preferably agitated, for example, by nitrogen burst agitation. The substrates are allowed to remain in the developer until all, or substantially all, of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solutions of organic bases free from metal ions such as tetraalkylammonium hydroxide, for example, tetramethylammonium hydroxide (TMAH), tetraethylammonium hydroxide (TEAH) and tetrabutylammonium hydroxide (TBAH) are preferred. Furthermore, if desired, the aqueous basic solution used as the developer may additionally contain any additives such as a surface active agent in order to improve the resulting development effect. After removal of the coated wafers from the developing solution, an optional, although not required, post-development heat treatment or bake may be employed to increase the adhesion of the coating as well as resistance to etching solutions and other substances. The post-development heat treatment can comprise the oven baking of the coating and substrate below the coating's softening point. The photoresist image at this point comprises a pattern of lines on the substrate surface having a linewidth of from about 100 nm to about 200 nm, or more usually from about 130 nm to about 200 nm.

The remaining photoresist layer is then overall exposed to sufficient electron beam radiation reduce the linewidth of the photoresist lines by from about 5% to about 50%, or more usually from about 5% to about 30%. The amount of linewidth reduction may be controlled by controlling the electron beam exposure conditions. The most preferably selection of exposure conditions may be easily determined by those skilled in the art. The electron beam irradiating is conducted with a uniform, large-area, overall electron beam exposure source which simultaneously exposes substantially all of the image areas of the photosensitive composition simultaneously. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision Corporation of San Diego, Calif., under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 300° C. The electron beam energy is preferably from about 0.5 to about 30 KeV, and more preferably from about 1 to about 12 KeV and most preferably from about 1 to about 9 KeV. The dose of electrons is from about 1 to about 500,000 $\mu C/cm^2$, preferably from about 50 to about 50,000 $\mu C/cm^2$ and more preferably from about 50 to about 5,000 $\mu C/cm^2$. The gas ambient in the electron beam tool can be any of the following gases: nitrogen, oxygen, hydrogen, argon, xenon, helium, ammonia, silane, a blend of hydrogen and nitrogen, ammonia or any combination of these gases. The electron beam current is preferably from about 1 to about 150 mA, and more preferably from about 1 to about 20 mA. The electron beam irradiating is conducted while the substrate is under a vacuum maintained in the range of from about $10^{-5}$ to about $10^2$ torr. Preferably, the electron beam exposing step is conducted with a wide, large beam of electron beam radiation from a uniform large-area electron beam source which simultaneously covers the entire substrate area, i.e. an area of from about 4 inches to about 256 square inches. The end result of the electron beam treatment will be photoresist lines which are thinner after exposure than prior to exposure. The reduced linewidth resist compositions of the present invention are resistant to acid-base etching solutions and provide effective protection for the unexposed resist-coated areas of the substrate. In addition, line edge roughness is a common problem for lines patterned via microlithography. The problem becomes increasingly serious with smaller and smaller linewidths. Using this method of producing smaller linewidths, bigger lines are imaged and developed, thus avoiding the line edge roughness problem, but one is still enable to produce small linewidths as the final result.

The following nonlimiting examples serve to illustrate the invention.

EXAMPLE 1

A layer of 193 nm photoresist (Sumitomo PAR-101A4) is spin-coated onto a series of silicon substrates having a layer of aluminum on its surface. The spin coater is a benchtop Laurell spinner. The dispense volume is 3–4 ml. The resist is spread over the substrate with a slow spin, 700–1000 rpm for ~10 seconds. Then the spin speed is ramped to 3000 rpm and remains there for 20–30 seconds. The photoresist layer and substrate are softbaked at 120° C. for 60 seconds on a hot plate to drive off most of the solvent. The film thickness decreases during the softbake as solvent is evolved. After the softbake the thickness is about 7,000 Å. The photoresist film is exposed to radiation of 193 nm wavelength, by a 193 nm stepper such as ISI ArF Microstepper, SVGL 193 Micrascan or ASML PAS 5500/900, with a numerical aperture of ~0.6 and a typical exposure dose of 5–10 mJ/cm$^2$ to a pattern of lines. This causes photoacid to be generated in the exposed areas. The photoresist film undergoes a post-exposure bake at 120° C. for 60 seconds to thermally activate the deprotection reaction. The result is a large differential dissolution between the exposed and unexposed areas. The photoresist film is developed in 2.38 wt % aqueous TMAH (tetramethylammonium hydroxide) developer solution. The exposed areas are dissolved away and the unexposed areas are left, forming the desired resist pattern of lines having a linewidth of 150 nm. Photoresist residue is removed from the substrate in an oxygen plasma descumming process. The substrate then undergoes an electron beam irradiation treatment in the ElectronCure tool made by the Electron Vision Group of Allied Signal. A uniform dose distribution is employed and doses range from 10–5,000 μC/cm$^2$. An average linewidth of each patterned film before cure is compared to those after cure to determine the extent of linewidth reduction. Each photoresist film is measured with an in-line critical dimension scanning electron microscope to obtain linewidths. The electron beam process modifies the lines of unexposed photoresist film and causes the linewidth to be reduced by 25%, in preparation for etch processing.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have discussed above, and all equivalents thereto.

What is claimed is:

1. A process for reducing the linewidth of a photoresist image which comprises:
   (a) coating and drying a photosensitive composition onto a substrate, which photosensitive composition comprises
      (i) at least one water insoluble, acid decomposable polymer, wherein said polymer is present in the photosensitive composition in an amount sufficient to form a uniform film of the composition components when it is coated on a substrate and dried;
      (ii) at least one photosensitive compound capable of generating an acid upon exposure to sufficient activating energy, said photosensitive compound being present in an amount sufficient to substantially uniformly photosensitize the photosensitive composition;
   (b) imagewise exposing the photosensitive composition to sufficient activating energy to cause the photosensitive compound to generate sufficient acid to decompose the polymer in the imagewise exposed areas of the photosensitive composition and produce a latent pattern of lines having a linewidth of from about 100 nm to about 200 nm;
   (c) developing the photosensitive composition to thereby remove the exposed nonimage areas and leaving the unexposed image areas of the photosensitive composition in the form of a pattern of lines having a linewidth of from about 100 nm to about 200 nm;
   (d) controllably irradiating the image areas of the photosensitive composition to sufficient electron beam radiation to thereby reduce the linewidth by an amount of from about 5% to about 50%.

2. The process of claim 1 wherein the linewidth is reduced by an amount of from about 5% to about 30%.

3. The process of claim 1 wherein the polymer is substantially transparent to ultraviolet radiation at a wavelength of about 193 nm; the photosensitive compound is capable of generating an acid upon exposure to sufficient activating energy at a wavelength of about 193 nm and the imagewise exposing is conducted at a wavelength of about 193 nm.

4. The process of claim 1 wherein the polymer comprises a cyclic olefin, an acrylate, a methacrylate, an acrylate with a pendant alicyclic group, a norbornene containing polymer, an alicyclic polymer or combinations thereof.

5. The process of claim 1 wherein the polymer comprises a polyalkylacrylate or a polyalkylmethacrylate.

6. The process of claim 1 wherein the polymer has a molecular weight in the range of from about 1,000 to about 800,000.

7. The process of claim 1 wherein the photosensitive compound comprises an onium compound.

8. The process of claim 1 wherein the photosensitive compound comprises a sulfonium, iodonium or diazonium compound.

9. The process of claim 1 wherein the substrate is selected from the group consisting of silicon, aluminum, lithium niobate, polymeric resins, silicon dioxide, doped silicon dioxide, gallium arsenide, Group III/V compounds, oxides, silicon nitride, titanium, titanium nitride, tantalum, tantalum nitride, copper, polysilicon, ceramics, aluminum/copper mixtures and combinations thereof.

10. The process of claim 1 wherein the exposing is conducted with an ArF laser.

11. The process of claim 1 wherein the exposing is conducted with an ArF laser at an exposure dose of from about 1 mJ/cm$^2$ to about 10 mJ/cm$^2$.

12. The process of claim 1 wherein the photosensitive composition further comprises one or more residual solvents selected from the group consisting of propylene glycol alkyl ether, butyl acetate, ethylene glycol monoethyl ether acetate, diglyme, cyclopentanone and propylene glycol methyl ether acetate.

13. The process of claim 1 wherein said polymer is present in the photosensitive composition in an amount of from about 50% to about 99%, and the photosensitive compound is present in an amount of from about 1% to about 20% based on the weight of the non-solvent parts of the photosensitive composition.

14. The process of claim 1 wherein the developing is conducted with an aqueous alkaline solution.

15. The process of claim 1 wherein the developing is conducted with a metal ion free aqueous alkaline solution.

16. The process of claim 1 wherein the developing is conducted with an aqueous alkaline solution comprising sodium hydroxide, potassium hydroxide, tetramethyl ammonium hydroxide or mixtures thereof.

17. The process of claim 1 wherein the electron beam irradiating is conducted with a uniform, large-area, overall electron beam exposure source which simultaneously exposes substantially all of the image areas of the photosensitive composition simultaneously.

18. The process of claim 1 wherein the electron beam irradiating is conducted with a uniform large-area electron beam source which covers an exposure area of from about 4 square inches to about 256 square inches simultaneously.

19. The process of claim 1 wherein the electron beam irradiating is conducted with a source which generates an electron beam energy level ranging from about 0.5 to about 30 KeV.

20. The process of claim 1 wherein the electron beam irradiating is from a source which generates an electron dose ranging from about 1 to about 500,000 $\mu C/cm^2$.

21. The process of claim 1 wherein the electron beam irradiating is conducted from a source which generates an electron beam current of from about 1 to about 150 mA.

22. The process of claim 1 wherein the electron beam irradiating is conducted while heating the substrate to a temperature of from about 20° C. to about 450° C.

23. The process of claim 1 wherein the electron beam irradiating is conducted in a gas selected from the group consisting of nitrogen, oxygen, hydrogen, argon, xenon, helium, ammonia, silane, a blend of hydrogen and nitrogen, ammonia and mixtures thereof.

24. The process of claim 1 wherein the electron beam irradiating is conducted while the substrate is under a vacuum maintained in the range of from about $10^{-5}$ to about $10^2$ torr.

25. The process of claim 1 further comprising the step of heating the imagewise exposed photosensitive composition prior to developing, for a sufficient time and temperature to increase the rate at which the acid decomposes the polymer in the imagewise exposed areas of the photosensitive composition.

26. A process for producing a microelectronic device image which comprises:
  (a) coating and drying a photosensitive composition onto a substrate, which substrate comprises a material selected from the group consisting of silicon, aluminum, lithium niobate, polymeric resins, silicon dioxide, doped silicon dioxide, gallium arsenide, Group III/V compounds, oxides, oxynitrides, silicon nitride, titanium, titanium nitride, tantalum, tantalum nitride, copper, polysilicon, ceramics, aluminum/copper mixtures and combinations thereof, and which photosensitive composition comprises
    (i) at least one water insoluble, acid decomposable polymer, wherein said polymer is present in the photosensitive composition in an amount sufficient to form a uniform film of the composition components when it is coated on a substrate and dried;
    (ii) at least one photosensitive compound capable of generating an acid upon exposure to sufficient activating energy, said photosensitive compound being present in an amount sufficient to substantially uniformly photosensitive the photosensitive composition;
  (b) imagewise exposing the photosensitive composition to sufficient activating energy to cause the photosensitive compound to generate sufficient acid to decompose the polymer in the imagewise exposed areas of the photosensitive composition and produce a latent pattern of lines having a linewidth of from about 100 nm to about 200 nm;
  (c) developing the photosensitive composition to thereby remove the exposed nonimage areas and leaving the unexposed image areas of the photosensitive composition in the form of a pattern of lines having a linewidth of from about 100 nm to about 200 nm;
  (d) controllably irradiating the image areas of the photosensitive composition to sufficient electron beam radiation to thereby reduce the linewidth by an amount of from about 5% to about 50%.

27. A microelectronic device image produced by a process which comprises:
  (a) coating and drying a photosensitive composition onto a substrate, which substrate comprises a material selected from the group consisting of silicon, aluminum, lithium niobate, polymeric resins, silicon dioxide, doped silicon dioxide, gallium arsenide, Group III/V compounds, oxides, oxynitrides, silicon nitride, titanium, titanium nitride, tantalum, tantalum nitride, copper, polysilicon, ceramics, aluminum/copper mixtures and combinations thereof, and which photosensitive composition comprises
    (i) at least one water insoluble, acid decomposable polymer, wherein said polymer is present in the photosensitive composition in an amount sufficient to form a uniform film of the composition components when it is coated on a substrate and dried;
    (ii) at least one photosensitive compound capable of generating an acid upon exposure to sufficient activating energy, said photosensitive compound being present in an amount sufficient to substantially uniformly photosensitive the photosensitive composition;
  (b) imagewise exposing the photosensitive composition to sufficient activating energy to cause the photosensitive compound to generate sufficient acid to decompose the polymer in the imagewise exposed areas of the photosensitive composition and produce a latent pattern of lines having a linewidth of from about 100 nm to about 200 nm;
  (c) developing the photosensitive composition to thereby remove the exposed nonimage areas and leaving the unexposed image areas of the photosensitive composition in the form of a pattern of lines having a linewidth of from about 100 nm to about 200 nm;
  (d) controllably irradiating the image areas of the photosensitive composition to sufficient electron beam radiation to thereby reduce the linewidth by an amount of from about 5% to about 50%.

* * * * *